(12) United States Patent
Wang et al.

(10) Patent No.: US 9,824,940 B2
(45) Date of Patent: Nov. 21, 2017

(54) INTELLIGENT METROLOGY BASED ON MODULE KNOWLEDGE

(71) Applicant: Taiwan Semiconductor Manufacturing Co., Ltd., Hsin-Chu (TW)

(72) Inventors: Shiang-Bau Wang, Pingzchen (TW); Victor Y. Lu, Foster City, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/923,607

(22) Filed: Oct. 27, 2015

(65) Prior Publication Data

US 2017/0092548 A1 Mar. 30, 2017

Related U.S. Application Data

(60) Provisional application No. 62/234,710, filed on Sep. 30, 2015.

(51) Int. Cl.
| | |
|---|---|
| *H01L 21/66* | (2006.01) |
| *G01B 11/06* | (2006.01) |
| *H01L 21/67* | (2006.01) |
| *H01L 21/027* | (2006.01) |
| *H01L 21/308* | (2006.01) |
| *H01L 21/311* | (2006.01) |
| *H01L 21/3213* | (2006.01) |
| *H01L 21/3065* | (2006.01) |

(52) U.S. Cl.
CPC .......... *H01L 22/20* (2013.01); *G01B 11/0675* (2013.01); *H01L 21/0273* (2013.01); *H01L 21/3081* (2013.01); *H01L 21/31144* (2013.01); *H01L 21/32139* (2013.01); *H01L 21/67253* (2013.01); *H01L 21/3065* (2013.01); *H01L 21/31116* (2013.01); *H01L 21/32136* (2013.01)

(58) Field of Classification Search
CPC ......... H01L 22/00; H01L 22/12; H01L 22/20; H01L 22/10; H01L 21/67242; H01L 21/67253; H01L 21/67271; H01L 21/67288
See application file for complete search history.

(56) References Cited

U.S. PATENT DOCUMENTS 4,571,685 A * 2/1986 Kamoshida ....... H01L 21/67213
257/E21.521
6,157,867 A * 12/2000 Hwang ................. C23C 14/544
216/60

(Continued)

*Primary Examiner* — Syed Gheyas
(74) *Attorney, Agent, or Firm* — Eschweiler & Potashnik, LLC

(57) ABSTRACT

A method for intelligent inline metrology is a provided. A parameter of a workpiece is measured at a first set of inspection sites on the workpiece. A determination is made as to whether a first specification is met using the measurements at the first set of inspection sites. In response to the first specification being met, the parameter is estimated at a second set of inspection sites on the workpiece. In response to the first specification being unmet, the parameter is measured at the second set of inspection sites and a determination is made as to whether a second specification is met using the measurements at the second set of inspection sites. A system for intelligent inline metrology is also provided.

20 Claims, 10 Drawing Sheets

(56) References Cited

U.S. PATENT DOCUMENTS

| | | | |
|---|---|---|---|
| 6,410,351 B1* | 6/2002 | Bode | H01L 22/20 257/E21.525 |
| 7,043,325 B1* | 5/2006 | Adams, III | G05B 19/41875 257/E21.525 |
| 2007/0231930 A1* | 10/2007 | Funk | H01L 22/12 438/14 |

* cited by examiner

INTELLIGENT METROLOGY BASED ON MODULE KNOWLEDGE

REFERENCE TO RELATED APPLICATION

This Application claims the benefit of U.S. Provisional Application No. 62/234,710, filed on Sep. 30, 2015, the contents of which are incorporated herein by reference in their entirety.

BACKGROUND

The manufacture of integrated circuits (ICs) and semiconductor devices is a complex process involving the use of many semiconductor manufacturing processes and tools. As such, faults can and do occur during the manufacture of ICs and semiconductor devices. A fault can render a workpiece unusable and/or waste downstream resources, such that much effort is placed on detecting and mitigating faults. Systems commonly employed to detect and mitigate faults include advanced process control (APC) systems and statistical process control (SPC) systems. These systems employ measurements by inline metrology tools to monitor and check that workpieces are within specifications and/or control limits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
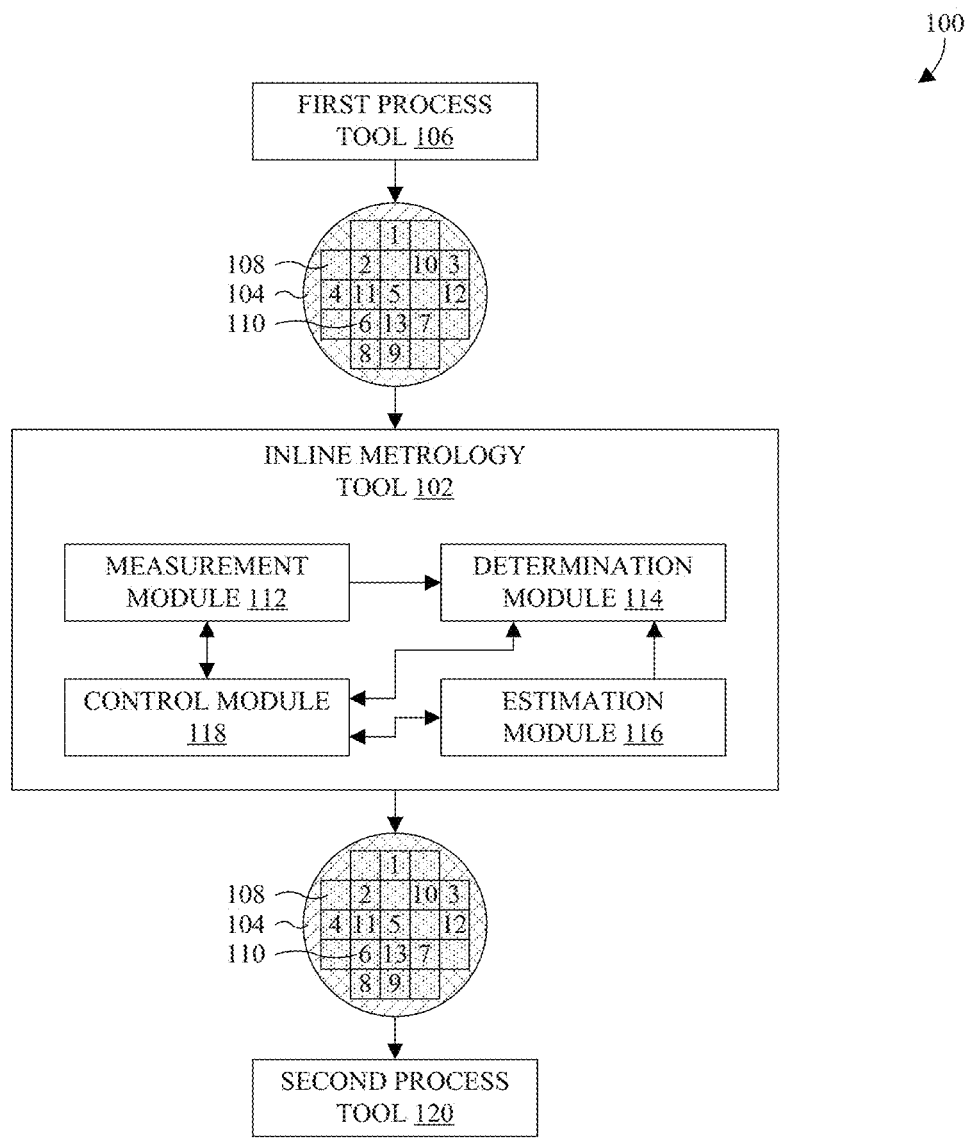
FIG. 1 illustrates a block diagram of some embodiments of a system with an intelligent inline metrology tool.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Inline metrology tools may be employed to measure parameters of workpieces after corresponding semiconductor manufacturing processes are performed on the workpieces. Further, control systems, such as advanced process control (APC) systems or statistical process control (SPC) systems, may use the measurements to detect and/or mitigate faults. For example, after a parameter, such as film thickness, of a workpiece is measured, a control system may determine whether the measurement is within SPC control limits (i.e., statistically normal limits) or design specification limits. If the measurement is within these limits, the workpiece may proceed to a subsequent semiconductor manufacturing process. If the measurement is out of the design specification limits, troubleshooting may be performed and the workpiece may be scrapped. If the measurement is out of SPC control limits, troubleshooting may be performed, but the workpiece may proceed to the subsequent processing step.

A shortcoming with the foregoing metrology and control is that expensive metrology capacity may be wasted on the "normal" measurements (i.e., measurements within control and specification limits). For example, measurements of a parameter are collected at a fixed number of inspection sites on a workpiece before being evaluated. However, where the measurements at the first few inspection sites are normal, there is a high probability that the measurements at the other inspection sites will be normal. Hence, metrology capacity may be wasted on these other inspection sites.

The present application is directed towards an intelligent inline metrology tool and a corresponding process for reducing costs and increasing efficiency. In some embodiments, after a first semiconductor manufacturing process is performed on a workpiece, a parameter is measured at a first set of inspection sites on the workpiece. A determination is made as to whether a first specification is met using the measurements of the first set of inspection sites. If so, the parameter is estimated at a second set of inspection sites on the workpiece and the workpiece proceeds to a second semiconductor manufacturing process. Otherwise, the parameter is measured at the second set of inspection sites. After measuring the parameter at the second set of inspection sites, a determination is made as to whether a second specification is met using the measurements of the second set of inspection sites. If the second specification is unmet, the workpiece is scrapped and undergoes troubleshooting. Otherwise, the workpiece proceeds to the second semiconductor manufacturing process.

Advantageously, the inline metrology tool and the corresponding process reduce costs by freeing up metrology capacity. Measurements are not collected at the second set of inspection sites unless there is a high probability that the measurements will be out of specification. Further, manual handling of the workpiece is advantageously reduced. The workpiece is not handled unless the measurements of the second set of inspection sites are out of specification.

With reference to FIG. 1, a block diagram 100 of some embodiments of a system with an intelligent inline metrology tool 102 is provided. As illustrated, the metrology tool 102 is configured to receive a workpiece 104 from a first process tool 106. The first process tool 106 is configured to perform a first semiconductor manufacturing process on the workpiece 104, such as an etch process. The workpiece 104 may be, for example, a wafer and comprises a plurality of die regions 108, some of which are designated as inspection sites 110. For example, the workpiece 104 may comprise 13 inspection sites.

The metrology tool 102 comprises a measurement module 112, a determination module 114, an estimation module 116, and a control module 118. The measurement module 112 is configured to measure one or more parameters, such as thin film thickness or critical dimension, at the inspection sites 110. The measurement module 112 may, for example, use time-of-flight (TOF) or interferometry to measure the parameter(s). The determination module 114 is configured to determine whether measurements of the measurement module 112 fall within specifications. The estimation module 116 is configured to estimate the parameter(s) at first inspection sites based on measurements from second inspection sites. The control module 118 is configured to coordinate the measurement, determination, and estimation modules 112, 114, 116 to perform an intelligent inline metrology process. In accordance with some embodiments of the intelligent inline metrology process, a first subset of the inspection sites 110 are estimated or measured depending upon whether measurements at a second subset of the inspection sites meet a specification.

Advantageously, the measurements and the estimates at the inspection sites 110 are generated and evaluated in-situ within the intelligent inline metrology tool 102. Further, the intelligent inline metrology tool 102 advantageously reduces costs by freeing up expensive metrology capacity when the first subset of inspection sites are estimated, but not measured.

The modules 112, 114, 116, 118 of the metrology tool 102 may be implemented by hardware, software, or a combination of the two. For example, the control module 118 may be, for example, a microcontroller, a process, an application-specific integrated circuit (ASIC), or the like. Further, where the modules 112, 114, 116, 118 comprise software, the metrology tool 102 comprises or is otherwise associated with memory, such as FLASH memory, storing the software and one or more processors, such as a microprocessor, executing the software.

Figure 2:
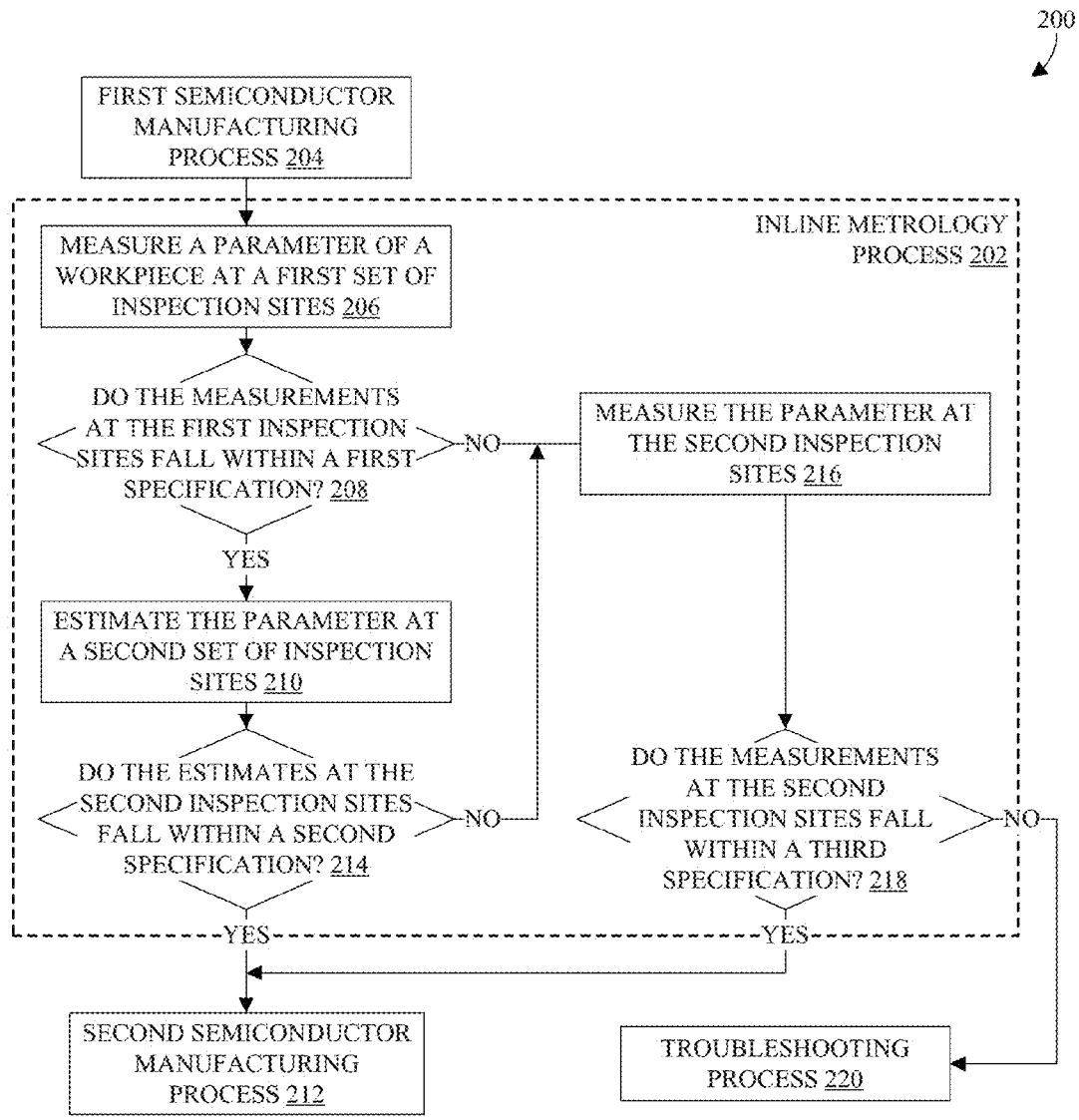
FIG. 2 illustrates a flowchart of some embodiments of an intelligent inline metrology process for use within the metrology tool of FIG. 1.

With reference to FIG. 2, a flowchart 200 of some embodiments of an intelligent inline metrology process is provided. The metrology process facilitates fault detection and may be performed by, for example, the control module 118 of FIG. 1. The metrology process is performed at 202, after a first semiconductor manufacturing process is performed at 204 on a workpiece. As illustrated, at 206, one or more parameter(s) are measured at a first set of inspection sites on the workpiece, such as inspection sites 1-9. Further, a first determination is made at 208 as to whether a first specification is met based on the first measurements. In some embodiments, the first determination further takes into account historical knowledge regarding other workpieces and/or historical knowledge regarding preceding semiconductor manufacturing processes performed on the workpiece.

If the first specification is met (i.e., yes) at 208, the parameter(s) are estimated in 210 at a second set of inspection sites on the workpiece, such as inspection sites 10-13. The estimates may, for example, be based on the first measurements, historical knowledge regarding other workpieces, historical knowledge regarding preceding semiconductor manufacturing processes performed on the workpiece, or a combination of the foregoing. In some embodiments, the workpiece next moves to a second semiconductor manufacturing process at 212. In other embodiments, a second determination is next made at 214 as to whether a second specification is met based on the estimates. In some embodiments, the second determination further takes into account the first measurements and/or historical knowledge. If the second specification is met, the workpiece moves to the second semiconductor manufacturing process at 212.

If the first or second specification is unmet (i.e., no) respectively at 208 or 214, the parameter(s) are measured in 216 at the second set of inspection sites on the workpiece and, in some embodiments, a third set of inspection sites on the workpiece. Further, a third determination is made at 218 as to whether a third specification is met based on the second measurements. In some embodiments, the third determination further takes into account the first measurements, the third measurements, historical knowledge, or a combination of the foregoing. If the third specification is met, the workpiece moves to the second semiconductor manufacturing process at 212. Otherwise, the workpiece is scrapped and a manual troubleshooting process is performed at 220.

Advantageously, the metrology process at 202 reduces costs by freeing up expensive metrology capacity. Measurements are not collected at the second set of inspection sites unless there is a high probability that the measurements will be out of specification. Further, manual handling of the workpiece is advantageously reduced. The workpiece is not manually handled unless the measurements at the second set of inspection sites are out of specification.

Figure 3:
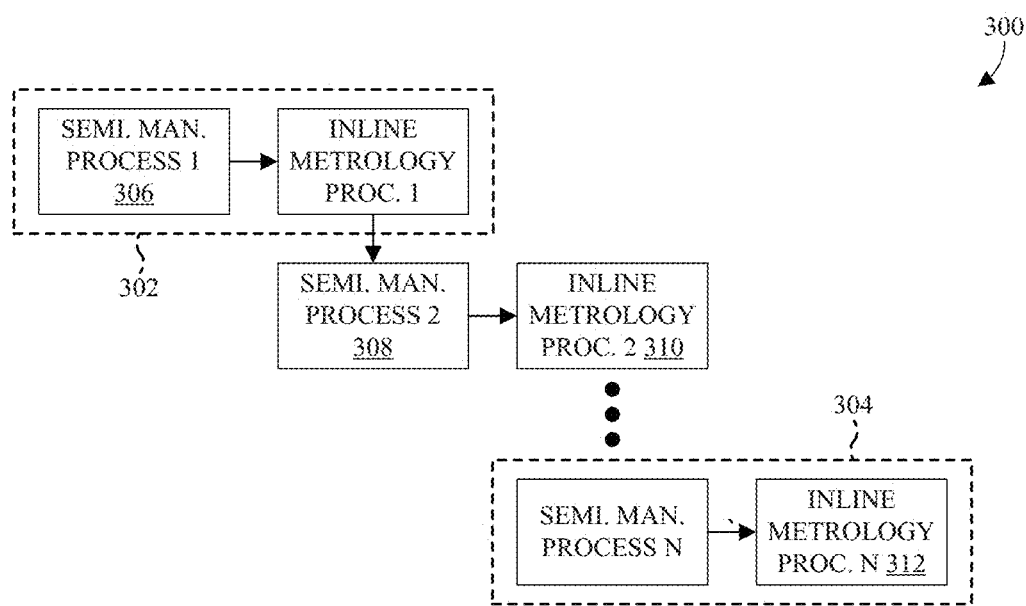
FIG. 3 illustrates a flowchart of some embodiments of a sequence for manufacturing an integrated circuit (IC) or semiconductor device using the metrology process of FIG. 2.

With reference to FIG. 3, a flowchart 300 of some embodiments of a sequence for manufacturing an integrated circuit (IC) or semiconductor device using the metrology process of FIG. 2 is provided. As illustrated, a predetermined number of steps (e.g., N>=1 steps) are sequentially performed on a workpiece at, for example, 302 and 304. In performing the predetermined number of steps, at least one of the predetermined number of steps employs the metrology process of FIG. 2. Each of the steps comprises a semiconductor manufacturing process at, for example, 306 or 308, and further comprises a subsequent inline metrology process at, for example, 310 or 312. The semiconductor manufacturing process may be, for example, a thin film process, a lithography process, or an each process. The inline metrology process may be, for example, the metrology process of FIG. 2 with specifications and/or historical knowledge tailored to the semiconductor manufacturing process.

Figure 4:
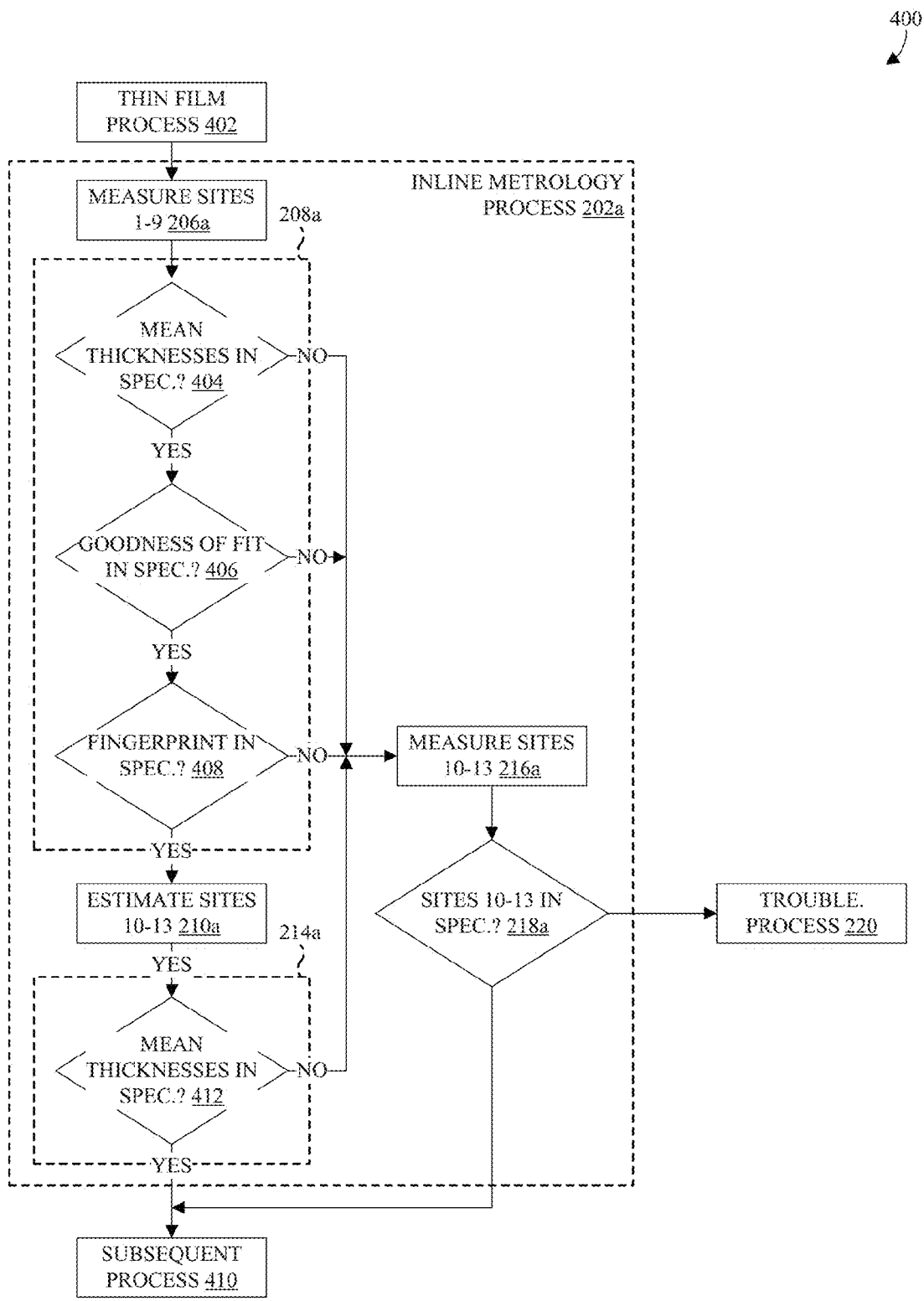
FIG. 4 illustrates a flowchart of some embodiments of the metrology process of FIG. 2 for thin film semiconductor manufacturing processes.

With reference to FIG. 4, a flowchart 400 of some embodiments of the metrology process of FIG. 2 for thin film semiconductor manufacturing processes is provided. As illustrated, a thin film semiconductor manufacturing process is performed at 402. The thin film process forms a thin film on a workpiece, and may be, for example, a furnace process, an atomic layer deposition (ALD) process, or a chemical vapor deposition (CVD) process.

After performing the thin film process at 402, a thin film metrology process is performed at 202a. At 206a, a thickness of the thin film is measured at a first set of inspection sites on the workpiece. Further, a first determination is made at 208a as to whether the first measurements meet a first specification. The first determination may, for example, include a first thickness determination at 404, a goodness of fit (GOF) determination at 406, a fingerprint determination at 408, or a combination of the foregoing.

The first thickness determination at 404 determines whether the first measurements are within first thickness limits of the first specification. In some embodiments, the first measurements are assessed together through comparison of a mean thickness to the first thickness limits. In other embodiments, the first measurements are individually assessed through individual comparison to the first thickness limits. Further, in some embodiments, the first thickness limits comprise upper and lower limits that are a fraction or percentage of corresponding upper and lower control limits in a SPC system. The fraction or percentage may be, for example, ⅔ or 60%. The upper and lower control limits may respectively be, for example, $\bar{t}+c\sigma$ and $\bar{t}-c\sigma$, where $\bar{t}$ is the mean thickness of thin films formed in the past, $\sigma$ is the standard deviation for thicknesses of the thin films formed in the past, and c is a predetermined constant. The predetermined constant c may be, for example, 2 or 3.

The GOF determination at 406 determines whether a GOF value of the first measurements is within GOF limits of the first specification. In some embodiments, the GOF value quantifies how well the first measurements match a predictive model for the thin film process at 402. The predictive model may be, for example, a probability distribution for thickness deviation, such that the GOF value quantifies how well the first measurements fit to the probability distribution. Further, the predictive model may be used by, for example, an advanced process control (APC) system controlling the thin film process at 402.

The fingerprint determination at 408 determines whether a local fingerprint (e.g., a thickness profile) of the workpiece matches a corresponding golden fingerprint within fingerprint limits of the first specification. The golden fingerprint is a vector of golden fingerprint values, one for each site of the first set of inspection sites. The golden fingerprint values correspond to historical thickness measurements at the first set of inspection sites for other workpieces that have undergone the thin film process at 402. The local fingerprint is a vector of local fingerprint values, one for each site of the first set of inspection sites. The local fingerprint values are the first measurements or are otherwise derived from the first measurements.

When determining whether the local fingerprint matches the corresponding golden fingerprint, the local fingerprint and the golden fingerprint are compared site-by-site. For each site, the difference between the local fingerprint value at the site and the golden fingerprint value at the site is compared to the fingerprint limits. The fingerprint limits may include, for example, upper and/or lower limits. In some embodiments, the golden fingerprint is specific to a location of a thin film process tool at which the workpiece was placed while the thin film was formed by the thin film process at 402.

If the first specification is met (i.e., limits of first specification are met), the thickness of the thin film is estimated in 210a at a second set of inspection sites using a predictive model. The predictive model is based on a relationship between thickness at the first set of inspection sites and thickness at the second set of inspection sites. For example, a thickness at inspection site 10 may be the mean of: 1) the mean at the first set of inspection sites; 2) the thickness at inspection site 3; and 3) the thickness at inspection site 6. In some embodiments, the predictive model is further based on historical knowledge regarding other workpieces, historical knowledge regarding preceding semiconductor manufacturing processes performed on the workpiece, or a combination of the foregoing. Further, in some embodiments, the predictive model is specific to a location of a thin film process tool at which the workpiece was placed while the thin film was formed by the thin film process at 402.

Thereafter, the workpiece next moves to a subsequent semiconductor manufacturing process at 410. Alternatively, a second determination is next made at 214a as to whether a second specification is met based on the estimates. The second determination may, for example, include a second thickness determination at 412. The second thickness determination determines whether the estimates are within thickness limits of the second specification. In some embodiments, the estimates are assessed together through comparison of a mean thickness to the thickness limits. In other embodiments, the estimates are assessed together with the first measurements through comparison of a mean thickness to the thickness limits. In yet other embodiments, the estimates are individually assessed through individual comparison to the thickness limits. Further, in some embodiments, the thickness limits of the first and second specifications are the same. If the second specification is met, the workpiece moves to the subsequent semiconductor manufacturing process at 410.

If the first or second specifications are unmet, the thickness of the thin film is measured in 216a at the second set of inspection sites on the workpiece and, in some embodiments, a third set of inspection sites on the workpiece. Further, a third determination is made at 218a as to whether a third specification is met based on the second measurements. If the third specification is met, the workpiece moves to the second semiconductor manufacturing process at 410. Otherwise, the workpiece is scrapped and a troubleshooting process is performed at 220.

Figure 5:
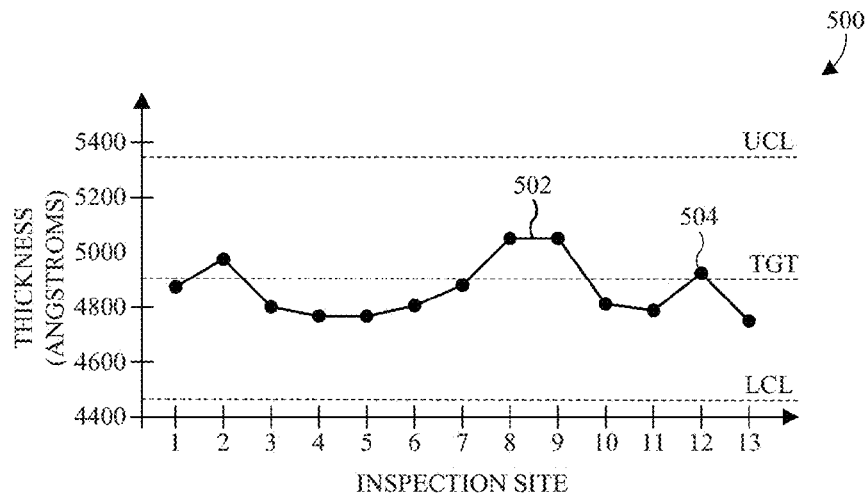
FIG. 5 illustrates a graph of some embodiments of a golden fingerprint used by the thin film metrology process of FIG. 4.

With reference to FIG. 5, a graph 500 illustrates some embodiments of a golden fingerprint 502 used by the thin film metrology process of FIG. 4. An independent axis of the graph 500 corresponds to inspection site, and a dependent axis of the graph corresponds to thickness. As illustrated, the golden fingerprint 502 is comprised of multiple thickness values 504 varying around a target (TGT) value, between an upper control limit (UCL) and a lower control limit (UCL) of an SPC system.

Figure 6:
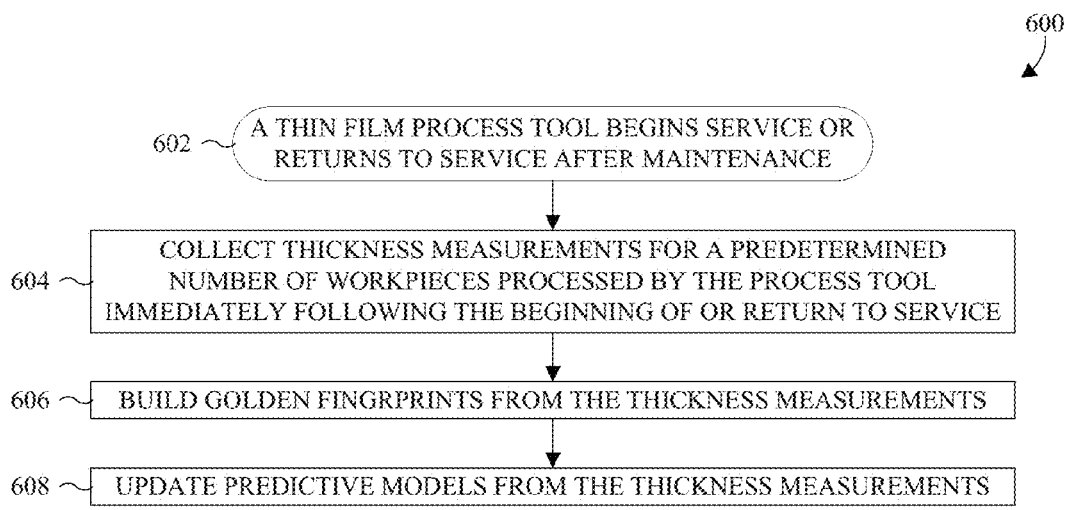
FIG. 6 illustrates a flowchart of some embodiments of a process for generating predictive models and golden fingerprints used by the thin film metrology process of FIG. 4.

With reference to FIG. 6, a flowchart 600 of some embodiments of a process for generating the predictive models and/or the golden fingerprints used by the thin film metrology process of FIG. 4 is provided. As illustrated, at 602, a thin film process tool configured to perform the thin film process of FIG. 4 begins service or otherwise returns to service after maintenance. Thereafter, thickness measurements are collected in 604 at inspection sites on each of a predetermined number of workpieces that are processed by the process tool immediately following the beginning of or return to service. For example, thickness measurements may be collected for 10,000 workpieces processed by the process tool immediately following the beginning of or return to service.

With the thickness measurements collected, one or more golden fingerprints are built at 606 from the thickness measurements. In some embodiments, the golden fingerprint(s) comprise a golden fingerprint for each location of the process tool. In such embodiments, the thickness measurements may be grouped by location and then combined by location into the golden fingerprint(s). To combine thickness measurements into a golden fingerprint, a golden fingerprint value is calculated for each of the inspection sites by averaging the thickness measurements at the site. In some embodiments, a golden fingerprint value at a inspection site is calculated as, for example, a mean thickness at the site. In other embodiments, a golden fingerprint value at an inspection site is calculated by subtracting a baseline value from the mean thickness at the site. The baseline value may, for example, be calculated as the mean thickness of the inspection sites.

Also, with the thickness measurements collected, one or more predictive models are built or otherwise updated at 608. The predictive model(s) estimate a thickness value at an inspection site based on the thickness measurements from other inspection sites. In some embodiments, the predictive model(s) comprise a predictive model for each location of the process tool. In such embodiments, the thickness measurements may be grouped by location and then used by location to build or otherwise update the predictive model(s). Further, in some embodiments, to build or update a predictive model, machine learning algorithms are applied to (e.g., trained on) the thickness measurements to identify a relationship between a first subset of the inspection sites (e.g., inspection sites to be measured) and a second subset of the inspection sites (e.g., inspection sites to be estimated).

Figure 7:
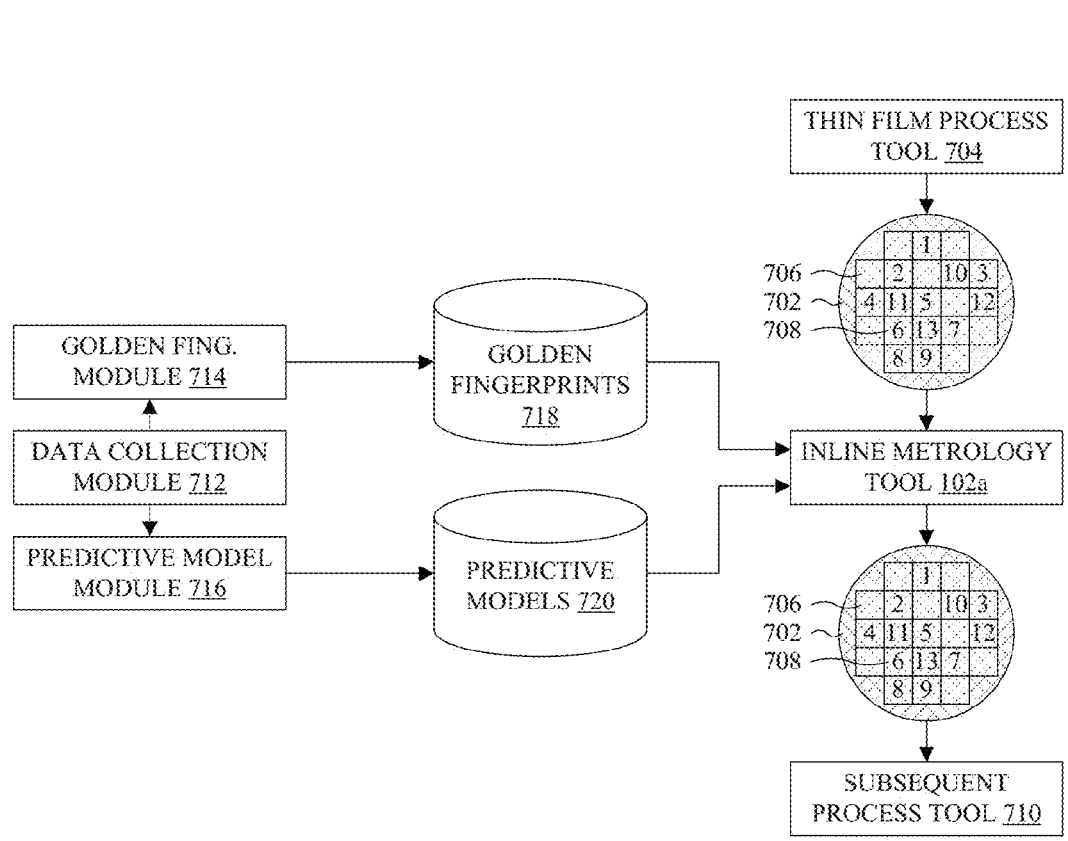
FIG. 7 illustrates a block diagram of some embodiments of a system configured to perform the processes of FIGS. 4 and 6.

With reference to FIG. 7, a block diagram 700 of some embodiments of a system configured to perform the processes of FIGS. 4 and 6 is provided. As illustrated, a thin film metrology tool 102a is configured to receive a workpiece 702 from a thin film process tool 704. The thin film process tool 704 is configured to perform a thin film semiconductor manufacturing process to form a thin film on the workpiece 702. The workpiece 702 comprises a plurality of die regions 706, some of which are designated as inspection sites 708.

After the metrology tool 102a receives the workpiece 702, the metrology tool 102a is configured to measure and/or estimate a thickness of the thin film at the inspection sites 708, depending upon an operating mode of the metrology tool 102a. Further, the workpiece 702 moves on to a subsequent process tool 710, unless out of specification.

When the thin film process tool 704 returns to service from maintenance and/or begins service, the metrology tool 102a is in a data collection mode until the thin film process tool 704 has processed a predetermined number of workpieces. In the data collection mode, a data collection module 712, a golden fingerprint module 714, and a predictive model module 716 are configured to perform the process of FIG. 6, and to update a golden fingerprints database 718 and a predictive models database 720.

After the thin film process tool 704 has processed a predetermined number of workpieces, the metrology tool 102a is in an optimized mode. In the optimized mode, the metrology tool 102a operates according to the metrology process of FIG. 4. Further, the metrology tool 102a makes use of the golden fingerprints database 718 for analysis of a first specification, and makes use of the predictive models database 720 for estimating thickness values at select inspection sites.

The modules 712, 714, 716 of the system may be implemented by hardware, software, or a combination of the two. Further, where the modules 712, 714, 716 comprise software, the system includes or is otherwise associated with a memory storing the software and a processor executing the software. Beyond the modules 712, 714, 716, the databases 718, 720 are implemented by storage devices, such as FLASH memory devices.

Figure 8:
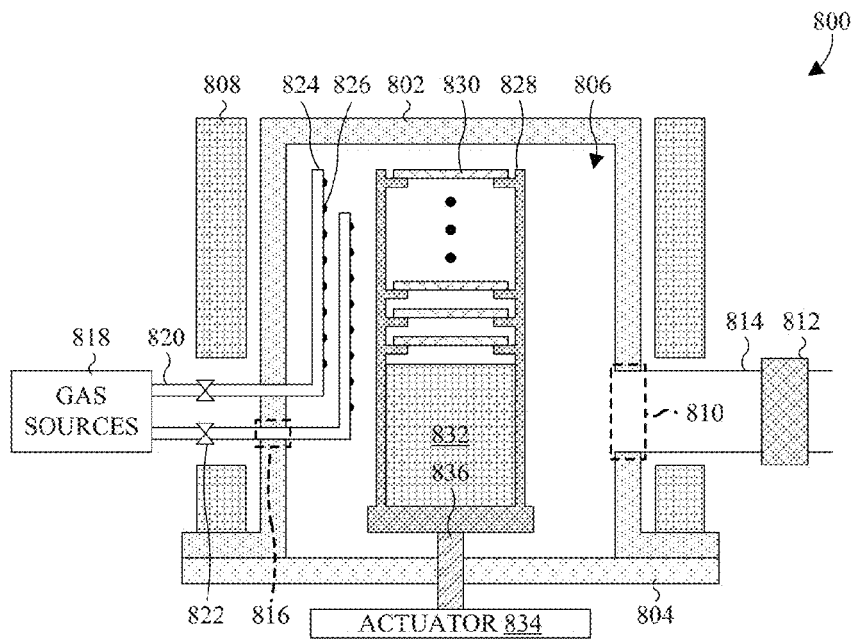
FIG. 8 illustrates a cross-sectional view of some embodiments of a thin film process tool in the system of FIG. 7.

With reference to FIG. 8, a cross-sectional view 800 of some embodiments of the thin film process tool 704 of FIG. 7 is provided. As illustrated, upper and lower components 802, 804 of a housing define a reactor chamber 806 that is laterally surrounded by a first heater 808. An exhaust outlet 810 is arranged in the housing and configured to provide gases from the reactor chamber 806 to an exhaust pump 812 through an exhaust outlet line 814. Further, gas inlets 816 are arranged in the housing and configured to provide gases from one or more gas sources 818 through corresponding gas inlet lines 820. In some embodiments, valves 822 corresponding to the gas inlet lines 820 are arranged along the gas inlet lines 820 and configured to control the flow (e.g., flow rate) of the gases to the gas inlets 816.

Gas distribution lines 824 and corresponding nozzles 826 are arranged in the reactor chamber 806, and extend from the gas inlets 816. The gas distribution lines 824 and the nozzles 826 are configured to introduce the gases into the reactor chamber 806. Further, a workpiece holder 828 is arranged in the reactor chamber 806, and is configured to support a plurality of workpieces 830 at a plurality of different locations. The workpiece holder 828 is further configured to support a second heater 832 arranged under the workpieces 830. The workpiece holder 828 is arranged over and connected to an actuator 834 by a shaft 836. The actuator 834 is configured to move the workpiece holder 828 into and out of the reactor chamber 806 while loading and unloading the reactor chamber 806.

Figure 9:
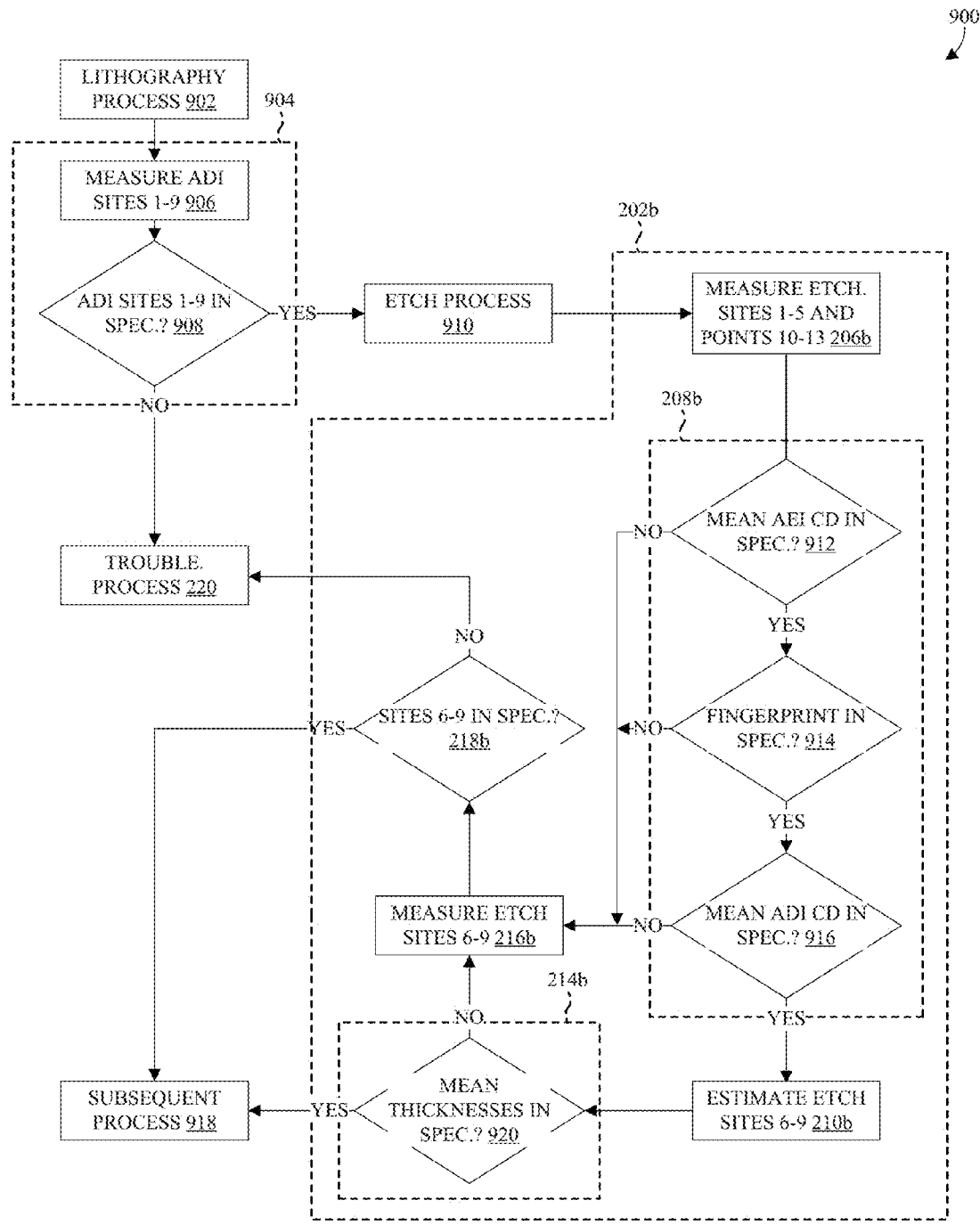
FIG. 9 illustrates a flowchart of some embodiments of the metrology process of FIG. 2 for lithography and etch semiconductor manufacturing processes.

With reference to FIG. 9, a flowchart 900 of some embodiments of the intelligent inline metrology process of FIG. 2 for lithography and etch semiconductor manufacturing processes is provided. As illustrated, a lithography semiconductor manufacturing process is performed at 902. The lithography process at 902 comprises the exposure of a photosensitive layer to radiation, as well as development of the photosensitive layer, to form a patterned photoresist layer on a workpiece. The lithography process at 902 may comprise, for example, an extreme ultraviolet (EUV) lithography process.

A lithography metrology process is next performed at 904 for after development inspection (ADI) of the patterned photoresist layer. At 906, an ADI critical dimension (CD) of the patterned photoresist layer is measured at a set of ADI sites on the workpiece. The ADI CD may be, for example, an opening width or other dimension of a feature in the patterned photoresist layer. In some embodiments, following the measuring at the ADI sites, a determination is made at 908 as to whether the measurements meet an ADI specification. If the ADI specification is met, the workpiece moves to a etch semiconductor manufacturing process at 910. If the ADI specification is unmet, the workpiece may be scrapped and a troubleshooting process may be performed at 220.

In other embodiments, following the measuring at the ADI sites, the lithography metrology process proceeds according to the metrology process of FIG. 2. For example, the ADI measurements may be compared to a first ADI specification. If the first ADI specification is met, the ADI CD of the patterned photoresist layer may be estimated at an additional set of ADI sites on the workpiece and the ADI estimates may be evaluated by a second ADI specification. If the second ADI specification is met, the workpiece may move to the etch process at 910. If the first or second ADI specifications are unmet, the additional ADI sites may be measured and evaluated by a third specification. If the third specification is met, the workpiece may move to the etch process at 910. If the ADI specification is unmet, the workpiece may be scrapped and a troubleshooting process may be performed at 220.

At 910, the etch process transfers a pattern of the patterned photoresist layer to a layer of the workpiece that underlies the photoresist layer. Further, in some embodiments, the etch process strips or otherwise removes the patterned photoresist layer from the workpiece. The etch process at 910 may comprise, for example, a plasma etch and/or a wet etch.

After the etch at 910, an etch metrology process is performed at 202b. The etch metrology process is performed for after etch inspection (AEI) of the transferred pattern, and is performed according to the metrology process of FIG. 1. At 206b, an AEI CD of the transferred pattern is measured at a first set of AEI sites on the workpiece. The AEI CD may be, for example, an opening width or other dimension of a feature in the transferred pattern. The first AEI sites overlaps with the ADI sites, but the two sets are not the same. Further, the ADI measurements of the overlapping sites correspond to the first AEI measurements of the overlapping sites, such that the differences between the ADI measurements and the corresponding first AEI measurements are indicative of how well the pattern was transferred.

At 208b, a first determination is made as to whether the first AEI measurements meet a first AEI specification. In some embodiments, the first determination further takes into account the ADI measurements and/or historical knowledge. The first determination includes a first AEI CD determination at 912, a fingerprint determination at 914, an ADI CD determination at 916, or a combination of the foregoing.

The first AEI CD determination at 912 determines whether the first AEI measurements are within AEI CD limits of the first AEI specification. In some embodiments, the first AEI measurements are assessed together through comparison of a mean AEI CD to the AEI CD limits. In other embodiments, the first AEI measurements are individually assessed through individual comparison to the AEI CD limits. Further, in some embodiments, the AEI CD limits comprise upper and lower limits that are a fraction or percentage, such as 60%, of corresponding upper and lower control limits in a SPC system.

The fingerprint determination at 914 determines whether a fingerprint of the workpiece is within fingerprint limits of the first specification. The fingerprint is a vector of fingerprint values, one for each overlapping site between the ADI and first AEI measurements. The fingerprint values are bias values (i.e., difference values) between the ADI measurements and the first AEI measurements, or are otherwise derived from the bias values. Hence, the fingerprint may be, for example, a bias profile. In some embodiments, the fingerprint values are assessed together through comparison of a mean fingerprint value to the fingerprint limits. In other embodiments, the fingerprint values are individually assessed through individual comparison to the fingerprint limits.

The ADI CD determination at 918 determines whether the ADI measurements at the non-overlapping sites between the ADI and first AEI measurements are within ADI CD limits of the first AEI specification. In some embodiments, the ADI measurements at the non-overlapping sites are assessed together through comparison of a mean ADI CD to the ADI CD limits. In other embodiments, the ADI measurements at the non-overlapping sites are individually assessed through individual comparison to the ADI CD limits. Further, in some embodiments, the ADI CD limits comprise upper and lower limits that are fractions or percentages, such as 60%, of corresponding upper and lower control limits in a SPC system.

If the first AEI specification is met (i.e., limits of first AEI specification are met), the AEI CD of the transferred pattern is estimated in 110b at a second set of AEI sites using a predictive model. The second AEI sites correspond to the non-overlapping ADI sites between the ADI measurements and the first AEI measurements. The predictive model may, for example, be based on the first AEI measurements, the ADI measurements, historical knowledge, or a combination of the foregoing.

In some embodiments, the predictive model estimates the AEI CD at the second AEI sites using a correlation matrix of correlation values between bias values at the overlapping sites and bias values at the second AEI sites. For example, the predictive model may estimate the AEI CD at a site by estimating a bias value at the site and subsequently adding or subtracting the estimate to or from the ADI measurement for the site. The bias value may be estimated by, for example, calculating a contribution value for each of the overlapping sites and summing the contribution values. A contribution value for a site may be calculated as, for example, a product of a corresponding correlation value of the correlation matrix and a corresponding bias value. The correlation matrix may be, for example, specific to a process tool pair that was used to perform the lithography and etch processes on the workpiece, or may be, for example, specific to a chamber of an etch tool used to perform the etch process at 910.

In some embodiments, the predictive model may further estimate the AEI CD at the second AEI sites using: A) a difference between a trim time used to control the etch process at 910 and a target trim time; B) a trim rate while performing the etch process at 910; C) a difference between an offset used by an APC system while controlling the etch process at 910 and a normal offset; D) a historical correlation value between the first AEI sites and the second AEI sites; or E) a combination of the foregoing. For example, the predictive model may estimate the AEI CD at a site by estimating a bias value at the site, by summing the estimate with the ADI measurement for the site and the historical correlation value of D), and by lastly subtracting a trim-based quantity from the sum. A contribution value for a site may be calculated as above, less a product of the trim difference of A) and the trim rate of B). The trim-based quantity may be calculated by, for example, calculating a product of the trim difference of A) and the trim rate of B), and summing the product with the offset difference of C).

Thereafter, the workpiece next moves to a subsequent semiconductor manufacturing process at 918. Alternatively, a second determination is next made at 214b as to whether a second AEI specification is met based on the AEI estimates. The second determination includes a second AEI CD determination at 920. The second AEI CD determination determines whether the AEI estimates are within AEI CD limits of the second specification. In some embodiments, the AEI estimates are assessed together through comparison of a mean AEI CD to the AEI CD limits. In other embodiments, the AEI estimates are assessed together with the first AEI measurements through comparison of a mean AEI CD to the AEI CD limits. In yet other embodiments, the AEI estimates are individually assessed through individual comparison to the AEI CD limits. Further, in some embodiments, the AEI CD limits of the first and second AEI specifications are the same. If the second AEI specification is met, the workpiece moves to the subsequent semiconductor manufacturing process at 918

If the first or second AEI specifications are unmet, the AEI CD is measured in 216b at the second AEI sites and, in some embodiments, a third set of AEI sites on the workpiece. Further, a third determination is made at 218b as to whether a third AEI specification is met based on the second AEI measurements. If the third AEI specification is met, the workpiece moves to the subsequent semiconductor manufacturing process at 918. Otherwise, the workpiece is scrapped and a troubleshooting process may be performed at 220.

Figures 10, 11:
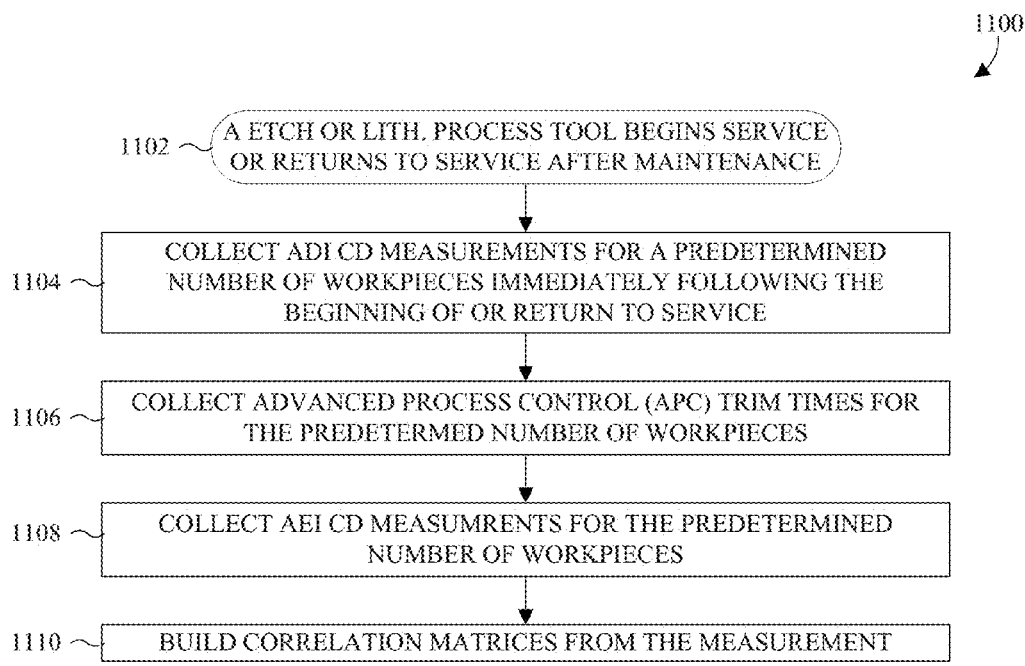
FIG. 10 illustrates a table of some embodiments of a correlation matrix used to estimate a critical dimension (CD) of a transferred pattern in FIG. 9.
FIG. 11 illustrates a flowchart of some embodiments of a process for collecting data used by the etch metrology process of FIG. 9.

With reference to FIG. 10, a table 1000 illustrates some embodiments of a correlation matrix used to estimate a CD of a transferred pattern in FIG. 9. As illustrated, columns 1002 correspond to a first set of inspection sites, and rows 1004 correspond to a second set of inspection sites. Further, each cell 1006 comprises a correlation value that quantifies a correlation between bias values at the pair of corresponding inspection sites.

With reference to FIG. 11, a flowchart 1100 of some embodiments of a process for collecting data used by the etch metrology process of FIG. 9 is provided. As illustrated, at 1102, an etch or lithography tool begins service or returns to service after maintenance and is associated with a companion tool. Where the tool beginning or returning to service is a lithography tool, the companion tool is an etch tool downstream from the lithography tool. Where the tool beginning or returning to service is an etch tool, the companion tool is a lithography tool upstream from the etch tool.

At 1104, ADI CD measurements are collected for a predetermined number of workpiece processed by the process tool pair immediately following the beginning or return to service. The ADI CD measurements comprise measurements at a set of inspection sites on each of the predetermined number of workpieces. The ADI CD measurements are collected while the predetermined number of workpieces is being processed by the process tool pair, and ADI CD measurements for an individual workpiece are collected after processing by the lithography tool, but before processing by the etch tool.

At 1106, trim times used by the lithography tool while processing the predetermined number of workpieces are collected for each of the predetermined number of workpieces. In some embodiments, the trim times are maintained and/or otherwise controlled by an APC system. The trim times are collected while the predetermined number of workpieces is being processed by the process tool pair.

At 1108, AEI CD measurements are collected for the predetermined number of workpieces. The AEI CD measurements comprise measurements at the set of inspection sites on each of the predetermined number of workpieces. The AEI CD measurements are collected while the predetermined number of workpieces is being processed by the process tool pair, and AEI CD measurements for an individual workpiece are collected after processing by the etch tool, such as immediately after processing by the etch tool.

At 1110, the inspection sites are divided into a first subset and a second subset. Further, a correlation matrix is built relating measurements at the first subset of sites to measurements at the second subset of sites. The correlation matrix comprises a correlation value relating each site of the first subset to each site of the second subset. In some embodiments, bias values are calculated for each AEI-ADI CD measurement pair, and subsequently combined into the correlation values using a least square error method. For example, supposing a correlation value is between a first site of the first subset and a second site of the second subset, the least square error method may be used to determine how well the bias values at the first site correlate with the bias values at the second site.

Figure 12:
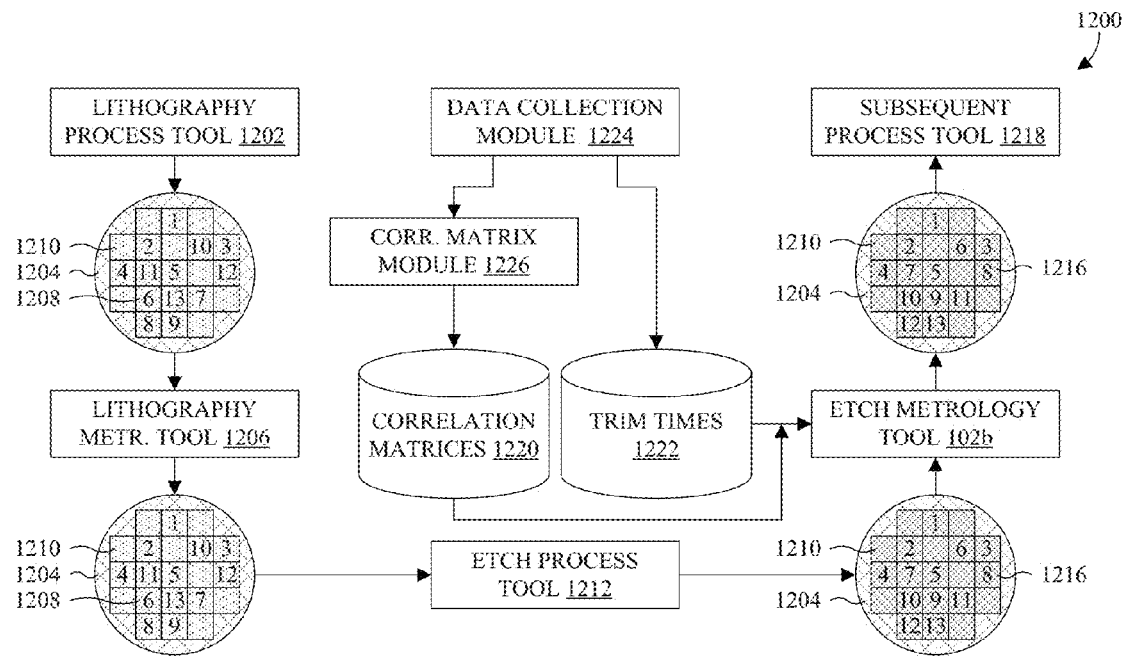
FIG. 12 illustrates a block diagram of some embodiments of a system configured to perform the processes of FIGS. 9 and 11.

With reference to FIG. 12, a block diagram 1200 of some embodiments of a system configured to perform the processes of FIGS. 9 and 11 is provided. As illustrated, a lithography process tool 1202 is configured to perform a lithography semiconductor manufacturing process, such as a EUV lithography process, on a workpiece 1204 to form a pattern in a photoresist layer on the workpiece 1204. Further, a lithography metrology tool 1206 is configured to measure and/or estimate a CD of the photoresist pattern at ADI sites 1208 of the workpiece 1204, depending upon an operating mode of the system. The ADI sites 1208 correspond to die regions 1210 on the workpiece 1204.

Thereafter, the workpiece 1204 moves to an etch process tool 1212 that is configured to transfer the pattern of the photoresist layer to a layer of the workpiece 1204 that underlies the photoresist layer. Further, an etch metrology tool 102b is configured to measure and/or estimate a CD of the transferred pattern at AEI sites 1216 on the workpiece 1204, depending upon an operating mode of the system. With the measurements and/or estimates complete, the workpiece moves on to a subsequent process tool 1218.

When the lithography process tool 1202 or the etch process tool 1212 returns to service from maintenance and/or begins service, the system is in a data collection mode until the lithography and etch process tools 1202, 1212 have processed a predetermined number of workpieces. Otherwise, the system is in an optimized mode. In the optimized mode, the lithography metrology tool 1206 and the etch metrology tool 302b are configured to perform the respective metrology processes of FIG. 9. Further, the etch metrology tool 302b makes use of a correlation matrix database 1220 and a trim time database 1222 for AEI site estimates. In the data collection mode, a data collection module 1224 and a correlation matrix module 1226 are configured to perform the process of FIG. 11, and to update the correlation matrix database 1220 and the trim time database 1222.

The modules 1224, 1226 of the system may be implemented by hardware, software, or a combination of the two. Further, where the modules 1224, 1226 comprise software, the system includes or is otherwise associated with a memory storing the software and a processor executing the software. Beyond the modules 1224, 1226, the databases 1220, 1222 are implemented by storage devices, such as FLASH memory devices.

Figure 13:
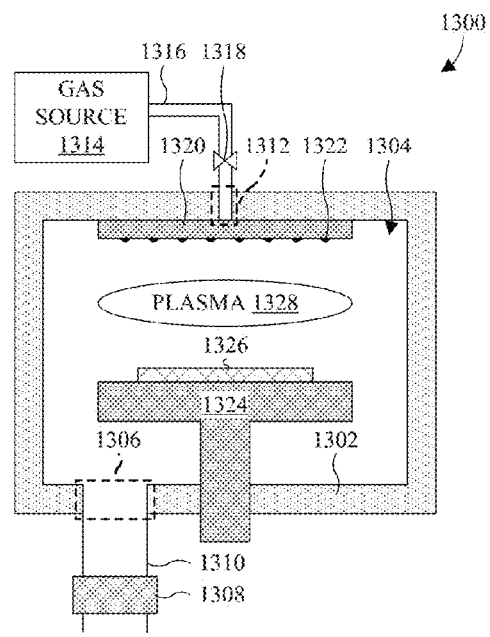
FIG. 13 illustrates a cross-sectional view of some embodiments of an etch process tool in the system of FIG. 12.

With reference to FIG. 13, a cross-sectional view 1300 of some embodiments of the etch process tool 1212 of FIG. 12 is provided. As illustrated, a housing 1302 defines a reactor chamber 1304. An exhaust outlet 1306 is arranged in a lower side of the housing 1302 and configured to provide gases from the reactor chamber 1304 to an exhaust pump 1308 through an exhaust outlet line 1310. Further, one or more gas inlets 1312 are arranged in an upper side of the housing 1302 and configured to provide gases from one or more gas sources 1314 through one or more corresponding gas inlet lines 1316. In some embodiments, one or more valves 1318 corresponding to the gas inlet line(s) 1316 are arranged along the gas inlet line(s) 1316 and configured to control the flow (e.g., flow rate) of the gases to the gas inlet(s) 1312.

A showerhead electrode 1320 is arranged in the reactor chamber 1304, connected to the gas inlets 1312. In some embodiments, nozzles 1322 are further arranged in the reactor chamber 1304 on the showerhead electrode 1320. The showerhead electrode 1320 and, in some embodiments, the nozzles 1322 are configured to introduce the gases into the reactor chamber 1304. Further, a support electrode 1324 is arranged in the reactor chamber 1304, under the showerhead electrode 1320. The support electrode 1324 is configured to support a workpieces 1326 and, in some embodiments, to heat the workpiece 1326. In operation of the etch process tool, process gases are introduced into the reactor chamber 1304 and a voltage is applied across the showerhead electrode 1320 and the support electrode 1324 to produce plasma 1328 for etching the workpiece 1326.

Figure 14:
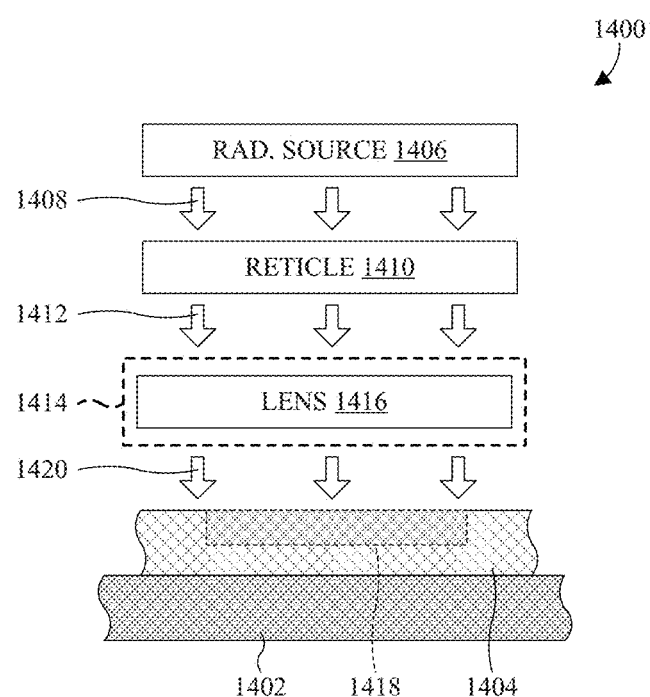
FIG. 14 illustrates a cross-sectional view of some embodiments of a lithography process tool in the system of FIG. 12.

With reference to FIG. 14, a cross-sectional view 1400 of some embodiments of the lithography process tool 1202 of FIG. 12 is provided. As illustrated, the lithography tool comprises a wafer support 1402 configured to support a workpiece 1404. Further, the lithography tool comprises a radiation source 1406 configured to emit radiation 1408 that impinges on a reticle 1410. The reticle 1410 is configured to selectively transmit the radiation 1408 according to a pattern. In some embodiments, the patterned radiation 1412 passes directly to the workpiece 1404. In other embodiments, the patterned radiation 1412 passes to the workpiece 1404 through an optical transfer system 1414.

The optical transfer system 1414 is arranged between the reticle 1410 and the wafer support 1402, and is configured to transfer the patterned radiation 1412 to the workpiece 1404. The optical transfer system 1414 may comprise, for example, a lens 1416. The lens 1416 is arranged between the reticle 1410 and the wafer support 1402 and may be, for example, configured to focus the patterned radiation 1412 on an exposure field 1418 of the workpiece 1404. In operation, the focused radiation 1420 impinges on the exposure field 1418 to transfer the pattern to a photosensitive layer in the exposure field 1418.

Thus, as can be appreciated from above, the present disclosure provides a method for intelligent inline metrology. A parameter of a workpiece is measured at a first set of inspection sites on the workpiece. A determination is made as to whether a first specification is met using the measurements at the first set of inspection sites. In response to the first specification being met, the parameter is estimated at a second set of inspection sites on the workpiece. In response to the first specification being unmet, the parameter is measured at the second set of inspection sites and a determination is made as to whether a second specification is met using the measurements at the second set of inspection sites.

In other embodiments, the present disclosure provides a system for intelligent inline metrology. A measurement module is configured to measure a parameter of a workpiece at a first set of inspection sites on the workpiece. A determination module is configured to determine whether a first specification is met using the measurements at the first set of inspection sites. The measurement module is further configured to measure the parameter at a second set of inspection sites in response to the first specification being unmet. The determination module is further configured to determine whether the second specification is met using measurements at a second set of inspection sites in response to the first specification being unmet. An estimation module is configured to estimate the parameter at the second set of inspection sites in response to the first specification being met.

In yet other embodiments, the present disclosure provides a method for intelligent inline metrology. A semiconductor manufacturing process is performed on a workpiece. An output parameter of the semiconductor manufacturing process is measured at a first set of inspection sites on the workpiece. A determination is made as to whether a first specification is met using the measurements at the first set of inspection sites and historical knowledge regarding a preceding semiconductor manufacturing process or other workpieces. In response to the first specification being met, the output parameter is estimated at a second set of inspection sites on the workpiece. In response to the first specification being unmet, the parameter is measured at the second set of inspection sites and a determination is made as to whether a second specification is met using the measurements at the second set of inspection sites.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for intelligent inline metrology, the method comprising:
   measuring a parameter of a workpiece at a first set of inspection sites on the workpiece, wherein the parameter is thickness of a thin film;
   determining whether a first specification is met using the measurements at the first set of inspection sites, wherein the determining of whether the first specification is met comprises comparing the measurements at the first set of inspection sites to historical values at the first set of inspection sites on a site-by-site basis, and wherein the historical values are individual to the sites of the first set of inspection sites;
   in response to the first specification being met, estimating the parameter at a second set of inspection sites on the workpiece; and
   in response to the first specification being unmet, measuring the parameter at the second set of inspection sites and determining whether a second specification is met using the measurements at the second set of inspection sites.

2. The method according to claim 1, further comprising:
   in response to the first specification being met, determining whether a third specification is met using the estimates at the second set of inspection sites; and in response to determining the third specification is unmet, measuring the parameter at the second set of inspection sites and determining whether the second specification is met using the measurements at the second set of inspection sites.

3. The method according to claim 2, wherein the determining of whether the third specification is met comprises:
determining whether a mean thickness of both the measurements at the first set of inspection sites and the estimates at the second set of inspection sites is within limits of the third specification.

4. The method according to claim 1, further comprising:
performing a semiconductor manufacturing process to form a thin film over the workpiece, wherein the measuring of the parameter comprises measuring a thickness of the thin film at each site of the first set of inspection sites.

5. The method according to claim 4, wherein the determining of whether the first specification is met comprises:
determining a mean thickness of the thickness measurements;
comparing the mean thickness to thickness limits of the first specification; and
comparing the thickness measurements to historical thickness measurements.

6. The method according to claim 1, further comprising:
performing a thin film semiconductor manufacturing process on the workpiece using a process tool, wherein the process tool comprises a plurality of workpiece locations, wherein the workpiece is arranged at a single location of the workpiece locations, and wherein the historical values are specific to the single location of the workpiece locations.

7. The method according to claim 6, wherein the estimating of the parameter is performed using a predictive model specific to the single location of the workpiece locations, such that another location of the workpiece locations has a different predictive model than the single location of the workpiece locations.

8. The method according to claim 1, wherein the measurements at the first set of inspection sites define a local thickness profile, wherein the local thickness profile is a vector comprising a measurement for each site of the first set of inspection sites, wherein the historical values define a historical thickness profile, wherein the historical thickness profile is a vector comprising a historical value for each site of the first set of inspection sites, wherein the historical value is derived from a historical average at a respective inspection site, and wherein the determining of whether the first specification is met comprises comparing the historical thickness profile to the local thickness profile on a site-by-site basis.

9. A method for intelligent inline metrology, the method comprising:
performing a semiconductor manufacturing process on a workpiece;
measuring an output parameter of the semiconductor manufacturing process at a first set of inspection sites on the workpiece;
determining whether a first specification is met using the measurements at the first set of inspection sites and historical knowledge regarding a preceding semiconductor manufacturing process or other workpieces;
in response to the first specification being met, estimating the output parameter at a second set of inspection sites on the workpiece;
in response to the first specification being unmet, measuring the output parameter at the second set of inspection sites and determining whether a second specification is met using the measurements at the second set of inspection sites;
patterning a photosensitive layer on the workpiece to form a pattern in the photosensitive layer, wherein the semiconductor manufacturing process is performed to transfer the pattern to a target layer underlying the photosensitive layer; and
measuring a critical dimension of the pattern in the photosensitive layer at a third set of inspection sites on the workpiece;
wherein the first and third sets of inspection sites overlap, but are not the same, and wherein the second set of inspection sites is defined by sites of the third set of inspection sites that do no overlap with the first set of inspection sites.

10. The method according to claim 9, wherein the semiconductor manufacturing process is an etch process, and wherein the historical knowledge pertains to a lithography process previously performed on the workpiece.

11. The method according to claim 9, further comprising:
determining whether a third specification is met using measurements at the third set of inspection sites; and
in response to the third specification being met, performing the semiconductor manufacturing process on the workpiece and measuring the output parameter of the semiconductor manufacturing process.

12. The method according to claim 11, wherein the photosensitive layer overlies the target layer of the workpiece, wherein the semiconductor manufacturing process is an etch process performed with the photosensitive layer in place to transfer the pattern to the target layer, and wherein the output parameter is the critical dimension of the pattern in the target layer.

13. The method according to claim 9, wherein the determining of whether the first specification is met comprises:
generating a vector of difference values, each corresponding to an overlapping site between the first and third sets of inspection sites, wherein the difference values are differences between the measurements at the first set of inspection sites and the measurements at the third set of inspection sites; and
comparing the generated vector to limits of the first specification.

14. A method for intelligent inline metrology, the method comprising:
performing a semiconductor manufacturing process on a workpiece;
measuring a parameter of the semiconductor manufacturing process at each site in a first set of inspection sites on the workpiece, wherein the parameter corresponds to a result of the semiconductor manufacturing process;
determining whether measurements at the first set of inspection sites fall within limits of a first specification;
in response to the measurements at the first set of inspection sites falling within the limits of the first specification, estimating the parameter at each site of a second set of inspection sites on the workpiece, wherein the second set of inspection sites does not overlap with the first set of inspection sites;
determining whether estimates at the second set of inspection sites fall within limits of a second specification;
in response to the measurements at the first set of inspection sites falling outside the limits of the first specification, or estimates at the second set of inspection sites falling outside the limits of the second specification, measuring the parameter at each site of the second set of inspection sites; and determining whether measurements at the second set of inspection sites fall within limits of a third specification;

wherein the measuring at the second set of inspection sites and the estimating at the second set of inspection sites are performed at the same sites.

15. The method according to claim 14, wherein the determining of whether the first set of inspection sites fall within the limits of the first specification comprises:

determining whether a bias profile for a subset of the first set of inspection sites is within the limits of the first specification.

16. The method according to claim 14, further comprising:

performing a lithography process on the workpiece to form a pattern in a photoresist layer on the workpiece; and measuring a second parameter of the workpiece at a third set of inspection sites on the workpiece, the second parameter describing a result of the lithography process;

wherein the semiconductor manufacturing process comprises an etch process to transfer the pattern to a layer underlying the photoresist layer, and wherein the parameter describes a result of the etch process.

17. The method according to claim 16, wherein the determining of whether the first set of inspection sites fall within the limits of the first specification comprises determining whether a subset of the measurements at the third set of inspection sites is within limits of the first specification, and wherein the subset corresponds to non-overlapping sites between the first and third sets of inspection sites.

18. The method according to claim 14, further comprising:

in response to the estimates at the second set of inspection sites falling within the limits of the second specification, or the measurements at the second set of inspection sites falling within the limits of the third specification, performing a second semiconductor manufacturing process on the workpiece.

19. The method according to claim 18, further comprising:

in response to the measurements at the second set of inspection sites falling outside the limits of the third specification, performing a troubleshooting process.

20. The method according to claim 16, wherein the determining of whether the measurements at the first set of inspection sites fall within the limits of the first specification comprises:

generating a vector of difference values, each corresponding to an overlapping site between the first and third sets of inspection sites, wherein the difference values are differences between the measurements at the first set of inspection sites and the measurements at the third set of inspection sites; and comparing the generated vector to limits of the first specification.

\* \* \* \* \*